United States Patent
Horn

(10) Patent No.: US 8,362,810 B2
(45) Date of Patent: Jan. 29, 2013

(54) LOCAL INTERCONNECT NETWORK RECEIVER

(75) Inventor: Wolfgang Horn, Klagenfurt (AT)

(73) Assignee: Micronas GmbH, Freiburg (DE)

( * ) Notice: Subject to any disclaimer, the term of this patent is extended or adjusted under 35 U.S.C. 154(b) by 110 days.

(21) Appl. No.: 12/597,239

(22) PCT Filed: Apr. 23, 2008

(86) PCT No.: PCT/EP2008/003259
§ 371 (c)(1),
(2), (4) Date: Jun. 1, 2010

(87) PCT Pub. No.: WO2008/128763
PCT Pub. Date: Oct. 30, 2008

(65) Prior Publication Data
US 2010/0231288 A1 Sep. 16, 2010

(30) Foreign Application Priority Data
Apr. 23, 2007 (DE) .......................... 10 2007 019 356

(51) Int. Cl.
*H03K 3/00* (2006.01)
(52) U.S. Cl. ..................................................... 327/108
(58) Field of Classification Search .................. None
See application file for complete search history.

(56) References Cited

U.S. PATENT DOCUMENTS

| 4,103,190 | A | 7/1978 | Beutler | |
|---|---|---|---|---|
| 7,221,224 | B2 * | 5/2007 | Koyasu | 330/252 |
| 7,248,634 | B2 * | 7/2007 | Koyasu | 375/256 |
| 7,414,439 | B2 * | 8/2008 | Sicard | 327/60 |
| 2005/0225389 | A1 * | 10/2005 | Koyasu | 330/252 |
| 2005/0265344 | A1 | 12/2005 | Harris et al. | |
| 2006/0039504 | A1 * | 2/2006 | Sicard | 375/317 |
| 2009/0029656 | A1 * | 1/2009 | Sicard | 455/91 |

FOREIGN PATENT DOCUMENTS

EP 1843526 10/2007

OTHER PUBLICATIONS

LIN Specification Package, Revision 2.1, LIN Consortium, pp. 1-9, 45-46 and 115, 2006.

* cited by examiner

*Primary Examiner* — Lincoln Donovan
*Assistant Examiner* — Khareem E Almo
(74) *Attorney, Agent, or Firm* — Muncy, Geissler, Olds & Lowe, PLLC

(57) ABSTRACT

The present invention relates to a LIN receiver having sleep/wake-up functionality, which has an input (LINI) to a LIN bus (LIN), an output (RXDO), terminals for at least one supply voltage (BVDD), and transistors (M1 through M17), the transistors (M1 through M17) being switched to activate the receiver in the recessive state of the LIN bus via a state change on the LIN bus into an active state of the receiver. In particular, the input (LINI) is connected between components of a voltage-to-current converter (SSW), in particular between a first and a second resistors, (R2, R2).

11 Claims, 3 Drawing Sheets

LOCAL INTERCONNECT NETWORK RECEIVER

PRIORITY INFORMATION

This patent application claims priority from PCT patent application PCT/EP2008/003259 filed Apr. 23, 2008, which claims priority to German patent application 10 2007 019 356.6 filed Apr. 23, 2007, both of which are hereby incorporated by reference.

BACKGROUND OF THE INVENTION

The present invention relates to a Local Interconnect Network (LIN) receiver, and in particular to a LIN receiver having sleep/wake-up functionality.

LIN Receivers are designed to recognize a voltage level on a LIN bus. According to LIN specification 2.1, page 115, voltage dividers having different division ratios are used on the LIN bus and on the power supply, in particular a battery, to evaluate a LIN level on the bus. FIG. 6 illustrates a prior art LIN receiver 600. A voltage divider chain composed of two resistors 602, 604 is connected between a ground voltage GND and a terminal or input LINI to the LIN bus. Another voltage divider chain also composed of two resistors 606, 608 is connected between ground GND and a positive supply voltage of the BVDD bus. The terminal for ground GND may also be connected as negative supply voltage of the bus. Contact points between the two resistors of the two voltage divider chains lead to a positive and negative input, 610, 611 respectively, of an operational amplifier 612 having an output on a line 614, to which received RXD data is provided.

The disadvantage of such an approach is the permanent power consumption of the divider chains and the required semiconductor surface area for implementing high-impedance resistors. This makes a compromise between power consumption and semiconductor surface area necessary. To implement a sleep function, the divider chains may be switched off. This results in that the level on the LIN bus can no longer be correctly evaluated and a wake-up function over the LIN bus is no longer possible. Accordingly, currently available LIN receivers and LIN transceivers having an integrated receiver function have a relatively high power consumption in the sleep mode.

An object of the present invention is to provide a circuit configuration or a LIN receiver having a corresponding circuit configuration that allows the power consumption to be reduced in the sleep mode.

SUMMARY OF THE INVENTION

A LIN receiver having sleep/wake-up functionality includes an input to a LIN bus, an output, and terminals for at least one supply voltage, the LIN receiver also includes a plurality of transistors which are switched to activate the receiver in the recessive state of the LIN bus via a state change on the LIN bus into an active state of the receiver.

The LIN receiver does not necessarily have to be understood here as an independent component. They also include appropriate circuit configurations, in particular circuit configurations in higher-level devices having such a LIN receiver functionality. This is true, in particular for LIN transceivers, which, in addition to a receiver functionality, also have a transmitter functionality.

A preferred LIN receiver of this type is characterized by very low power consumption in the recessive state of the LIN bus, i.e., in the sleep function mode. Nevertheless, the receiver may be automatically activated via a state change on the LIN bus into the active, or dominant, state, which provides a wake-up functionality. During the wake-up, i.e., activation or thereafter, the LIN receiver may then generate a signal, using which a processor may be activated, for example, via an interrupt.

Advantageously, except for leak currents, no current is consumed in the sleep mode. Depending on the specific embodiment, no high-impedance voltage dividers are needed. Even in the active mode, only a low current consumption occurs. In particular, automatic activation of the circuit is enabled in the event of activity on the LIN bus, so that a specific wake-up signal is not required. The hysteresis is advantageously proportional to the supply voltage.

In particular, such a LIN receiver, in which the input is connected between components of a voltage-to-current converter, is preferably connected between a first and a second resistor in particular.

A first resistor of the voltage-to-current converter may be connected and dimensioned as a pull-up resistor in such a way that, in the case of a dominant level at the input, current flows through the first resistor. At least one first, second, and third transistor is preferably connected to mirror the current flow through the first resistor, and at least one eighth and one fourteenth transistor and additional twelfth, thirteenth, and fifteenth transistors connected as cascode transistors are preferably connected to switch the LIN receiver and/or the output into the active mode.

In the LIN receiver, a second resistor of the voltage-to-current converter may be connected so it may be connected to a negative supply voltage or to ground with the aid of transistors.

At least one third and one fifteenth transistor may be connected between a positive supply voltage and the negative supply voltage or ground for comparing a current flow component through the first resistor and a current flow component through the second resistor.

One tenth and one eleventh transistor may be connected to the third and fifteenth transistors on the output side, in order to pull the output toward ground or to the negative supply voltage of the bus.

At least one fourth, one fifth, and one seventh transistor may be connected between the positive supply voltage and the negative supply voltage or to ground in such a way that a current flow component through the second resistor of the voltage-to-current converter activates the gate terminal of the seventh transistor and, through it, the fourth and the fifth transistors for compensating the current component through the second resistor. The current is mirrored onto the input by the fourth and fifth transistors. Viewed from the LIN bus outward, the second resistor thus becomes invisible.

In addition, at least one eighth and one fourteenth transistor may be connected between the positive supply voltage and the negative supply voltage or ground in such a way that, at recessive level at the input, they switch off a current flow through the second resistor with the aid of a switch. They may switch off the current flow, for example, via a twelfth transistor, which is activated using these transistors and is connected between the second resistor and the negative supply voltage or ground. The entire circuit thus becomes ultimately de-energized. This results in a low power consumption at the most, which, in the recessive state, is limited to leak currents both on the LIN bus and on the supply terminal.

A switch and, for generating a hysteresis, a seventeenth transistor may be connected in series between the second resistor and the negative supply voltage or ground, the switch then being switched to switch a current flow through the seventeenth transistor on or off, depending on a switching state at the output. Such a circuit configuration results in a hysteresis whose value is not constant, but proportional to the supply voltage. This behavior is advantageous, since the definition of hysteresis in the LIN specification refers to the supply voltage.

In general, the transistors may be dimensioned, with the aid of scaling factors, to appropriately reduce all currents, except those through a first resistor of the voltage-to-current converter, connectable to the positive supply voltage. Even high scaling factors are possible here, since the speed requirements in LIN receivers of this type are low if the maximum frequency of the LIN bus is fmax(LIN)=20 kHz in particular.

A sixteenth transistor may be connected as an integrated polarity reversal protection diode between a positive supply voltage and the other transistors. Due to an appropriate wiring of the gate of the sixteenth transistor, it is in Rdson mode in the case of a bus supply voltage of normal polarity, due to which, if it is appropriately dimensioned, a voltage drop may be neglected.

Since the above-named transistors are labeled with numbers, this is only a labeling feature for differentiating the individual transistors and not a numbering in the meaning of a numerical listing.

According to aspects deserving special mention, disadvantages are thus eliminated, depending on the design of the specific embodiments, by eliminating the divider chains on the supply or supply voltage by using the pull-up resistor prescribed by the LIN specification for signal evaluation. In addition, the entire circuit may be deactivated in the recessive state on the LIN bus. In the non-recessive state on the LN bus, automatic activation may take place.

An exemplary embodiment is described below with reference to different specific embodiments. Identical reference numerals in the different figures refer to identical or identically working components and functions, so that, in particular in the case of extended specific embodiments, reference is also made to the embodiments of the other and, in particular, previous figures regarding such identical reference numerals. In general, components of the other specific embodiments may, of course, be combined directly with the first specific embodiment even without specific embodiments described as connected in between.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
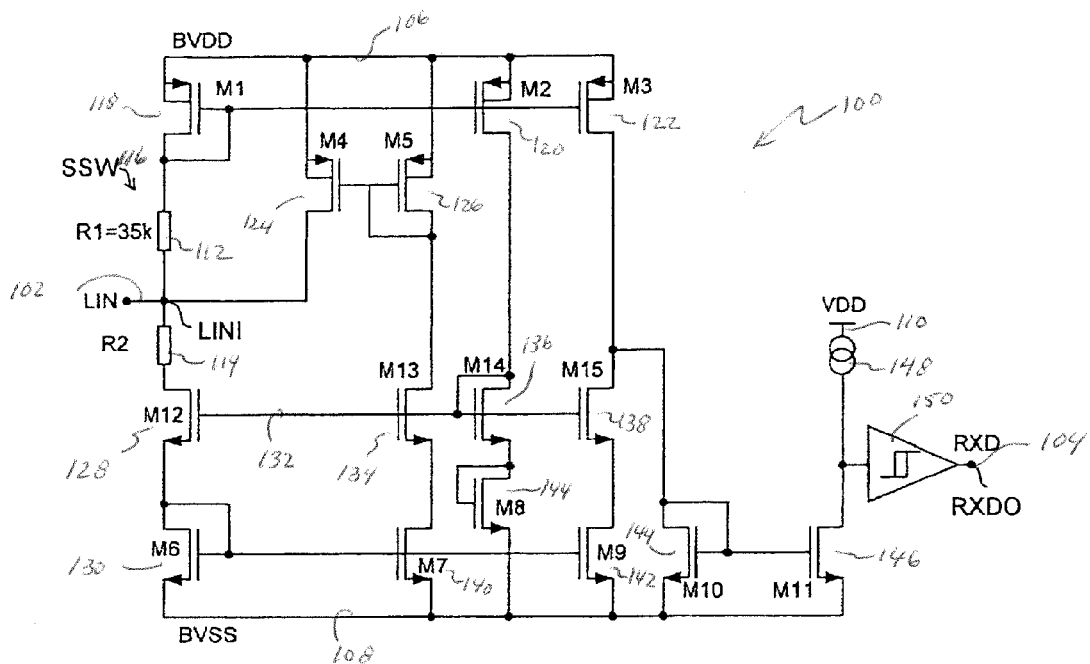
FIG. 1 illustrates a circuit schematic of a LIN receiver.

FIG. 1 illustrates a circuit schematic of a LIN receiver 100. The receiver receives an input signal on a line 102 from a bus, and provides an output signal on a line 104. The receiver receives power via a positive supply voltage BVDD on line 106, and negative supple voltage on line 108. As essentially known, the relative ratio of the negative and positive supply voltages BVSS, BVDD of the bus is relevant. In particular, the negative supply voltage on the line 108 may correspond to the ground terminal voltage. The receiver also receives supply voltage VDD on line 110.

The input signal LINI on the line 102 is connected between first and a second ohmic resistors R1, R2, 112,114, respectively. The first resistor R1 112 may have an impedance of 35 k ohms, for example. The first and second resistors R1, R2, thus form a voltage-to-current converter SSW 116.

A terminal of the first resistor R1 112 facing away from the input signal LINI on the line 102 is connected to a first transistor M1 118, specifically to its drain and gate. The source and bulk of the first transistor M1 118 are also connected to the positive supply voltage of the BVDD bus. In addition, the second terminal of the first resistor R1 112 is connected to a second transistor M2 120 and a third transistor M3 122, specifically to their gates. The source and bulk terminals of the second and third transistors M2, M3 120, 122 are connected to the positive supply voltage of the BVDD bus.

In addition, the positive supply voltage of the BVDD bus is applied to a fourth and a fifth transistor M4, M5 124, 126, specifically to their source and bulk terminals. In addition, the input signal LINI on the line 102 is connected to the drain of the fourth transistor M4 124. The gate terminals of the fourth and fifth transistors M4, M5 124, 126 are connected to the drain of the fifth transistor M5 126.

A second terminal of the second resistor R2 114 is connected to the negative supply voltage of the BVSS bus via a twelfth and a sixth transistor M12, M6 128, 130. The second resistor R2 is connected to the source of the twelfth transistor M12 128, the drain of twelfth transistor M12 128 is connected to the source and gate of the sixth transistor M6 130, and the drain of sixth transistor M6 130 is connected to the negative supply voltage of the BVSS bus.

The gate terminal of the twelfth transistor M12 128 is connected to a node 132 shared with gate terminals of a thirteenth transistor M13 134, of a fourteenth transistor M14 136, and of a fifteenth transistor M15 138. In addition, this node is connected to the source of the fourteenth transistor M14 136 and to the drain of the second transistor M2 120. In addition, the source of the thirteenth transistor M13 134 is connected to the gate terminal of the fourth and fifth transistors M4, M5 124,126. In addition, the source of the fifteenth transistor M15 138 is connected to the drain of the third transistor M3 122.

The gate terminal of the sixth transistor M6 130 is jointly connected to the gate terminals of a seventh transistor M7 140 and a ninth transistor M9 142. The drain of the thirteenth transistor M13 134 is connected to the source of the seventh transistor M7 140, and the drain of the seventh transistor M7 is connected to the negative supply voltage of the BVSS bus. The drain of the fourteenth transistor M14 136 is connected to the source and gate of an eighth transistor M8 144. The drain of the eighth transistor M8 144 is connected to the negative supply voltage of the BVSS bus. The source of the ninth transistor M9 142 is connected to the drain of the fifteenth transistor M15 138, and its drain is connected to the negative supply voltage of the BVSS bus.

The gate terminals of a tenth and an eleventh transistor M10, M11 144, 146 are connected to both the source of the tenth transistor M10 144 and the drain of the third transistor M3 122. The drain terminals of tenth and eleventh transistors M10, M11 are connected to the negative supply voltage of the BVSS bus. The drain of the eleventh transistor M11 is connected both to a current source 148 whose other input corresponds to supply voltage VDD and to a Schmitt trigger 150 whose output terminal corresponds to the RXDO output.

The first five transistors M1 through M5 are preferably designed as MOSFETs. In principle, however, the use of bipolar transistors, instead of MOSFETs, is also possible.

Regarding its functionality, the first resistor R1 112 corresponds to the pull-up resistor prescribed in the LIN specification. At the dominant level (low) on the LIN bus, i.e., on the LINI input on the line 102, current flows through the first resistor R1. This current flow is mirrored via the configuration of the first, second, and third transistors M1 through M3 and activated via the eighth and fourteenth transistors M8, M14 and via the twelfth, thirteenth, and fifteenth transistors M12, M13, M15 connected as cascode transistors. A current, which is mirrored by the sixth, seventh, and ninth transistors M6, M7, M9, thus also flows through the second resistor R2 114.

At the connection of the third and fifteenth transistors M3, M15 the two current components are compared via the two resistors R1, R2. If the component through the first resistor R1 dominates, a current flow occurs in the tenth transistor M10 144, which is mirrored via the eleventh transistor M11 146 and thereby pulls the output signal RXDO on the line 104 toward ground or the negative supply voltage of the BVSS bus. The current component through the second resistor R2 is undesirable in principle, since it is not provided in the LIN specification. Therefore, the current component is preferably compensated by the second resistor R2. For this purpose, the current from the seventh transistor M7 140 is mirrored onto the input signal LINI on the line 102 via the fifth and fourth transistors M5, M4 126, 124, respectively. Viewed from the LIN bus outward, the second resistor R2 114 thus becomes invisible.

At a regressive level on the LIN bus (high), there is no current flow in the first resistor R1, whereby the eighth and fourteenth transistors M8, M14 136,144, which are wired as MOS diodes, are switched off. The current flow in the second resistor R2 114 is thus suppressed by the twelfth transistor M12 128, and the entire circuit becomes de-energized. This results in no high power consumption, which is limited to leak currents both on the LIN bus and on the supply terminal.

Figure 2:
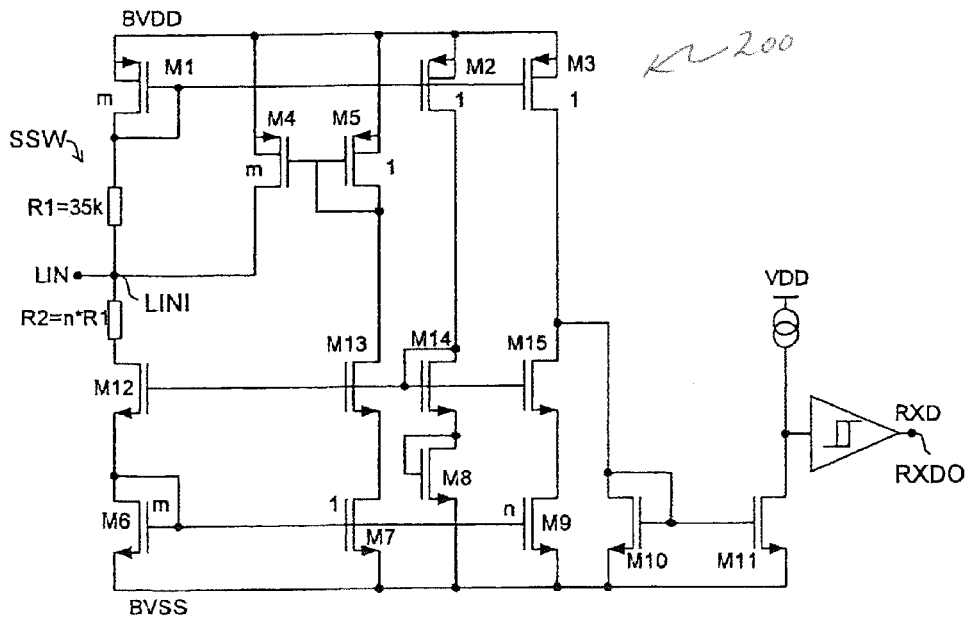
FIG. 2 illustrates a circuit schematic of a second embodiment of a LIN receiver.

FIG. 2 shows a second embodiment 200, which is used for reducing the power consumption in the active mode. Scaling factors n and/or m may be introduced for this purpose. For example, if a second scaling factor m is provided on the first, fourth, and sixth transistors M1, M4, M6, a factor 1 is provided on the second, third, fifth, and seventh transistors M2, M3, M5, M7, and a first scaling factor n is provided on the ninth transistor M9. The second resistor R2 is dimensioned as the product of the first scaling factor n and resistance 35 k$\Omega$, for example, of the first resistor R1. This reduces all currents except those through the first resistor R1 accordingly. Since the speed requirements for LIN receivers of this type are low because the maximum frequency of the LIN bus is fmax (LIN)=20 kHz, high scaling factors may be selected accordingly.

Figure 3:
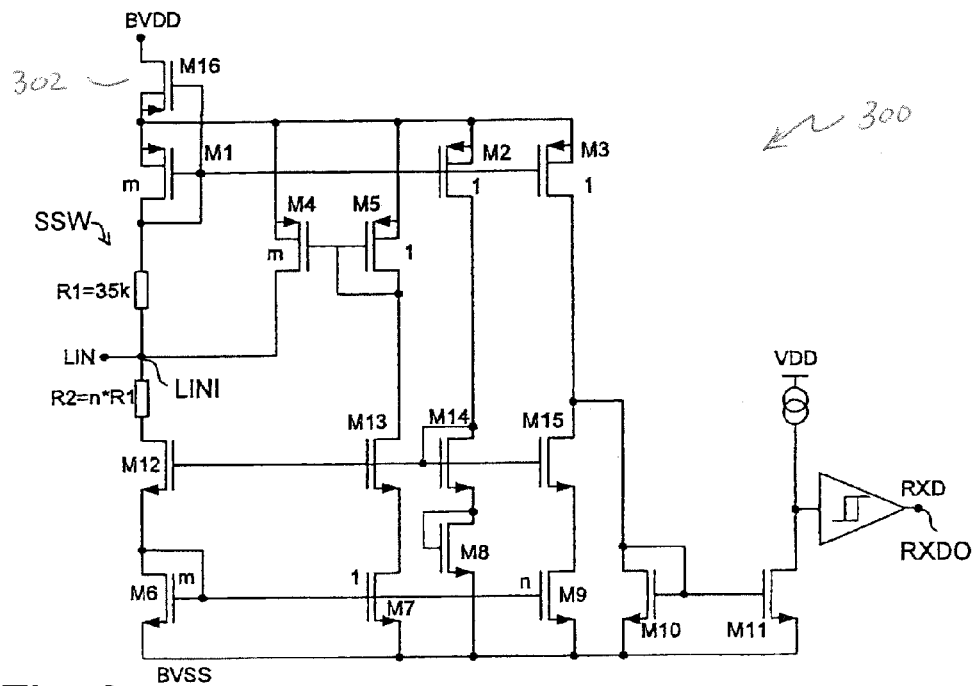
FIG. 3 illustrates a circuit schematic of a third embodiment of a LIN receiver.

FIG. 3 shows a third embodiment 300 which is extended with respect to the specific embodiment according to FIG. 2 by a sixteenth transistor M16 302, which is preferably another MOSFET. As is true also for the other transistors, however, appropriate circuits having bipolar transistors instead of field-effect transistors may also be constructed. The sixteenth transistor M16 302 is used as an integrated polarity reversal protection diode, the gate of the sixteenth transistor M16 being connected to the gate of the first transistor M1. Its drain and source are connected between the positive supply voltage of the BVDD bus and the source terminals of the first through fifth transistors M1 through M5. The positive supply voltage of the BVDD bus is thus no longer directly connected to the latter. Due to the wiring of the gate of the sixteenth transistor M16, in the case of normal polarity of the supply voltage of the BVDD bus, it is in the Rdson mode (Rdson=closing resistor or drain-source resistor), due to which, in the case of appropriate dimensioning, the voltage drop may be neglected.

Figure 4:
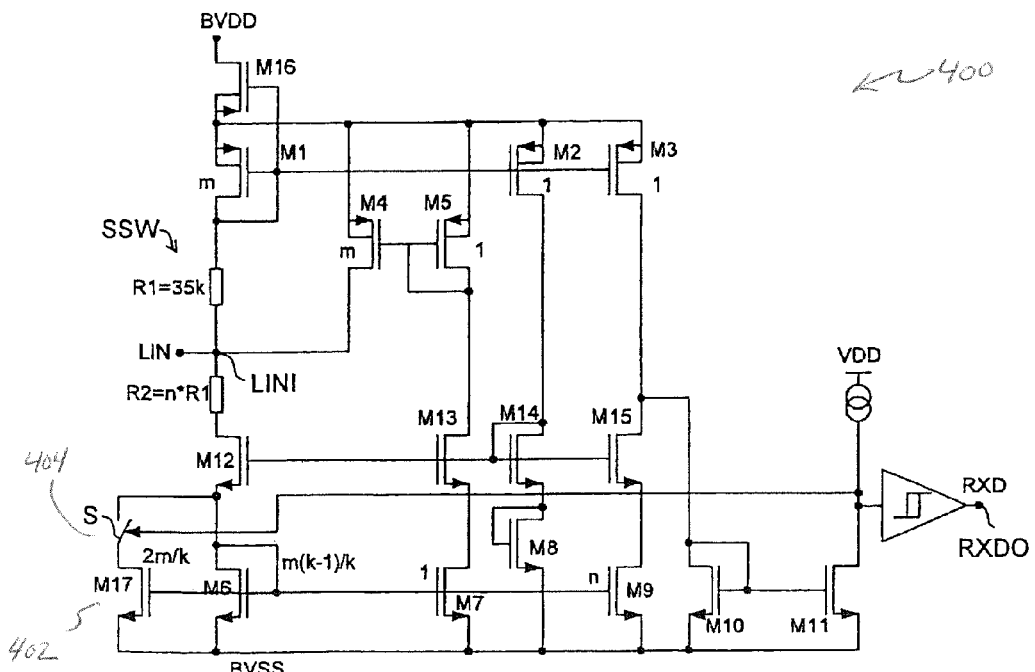
FIG. 4 illustrates a circuit schematic of a fourth embodiment of a LIN receiver.
Figure 5:
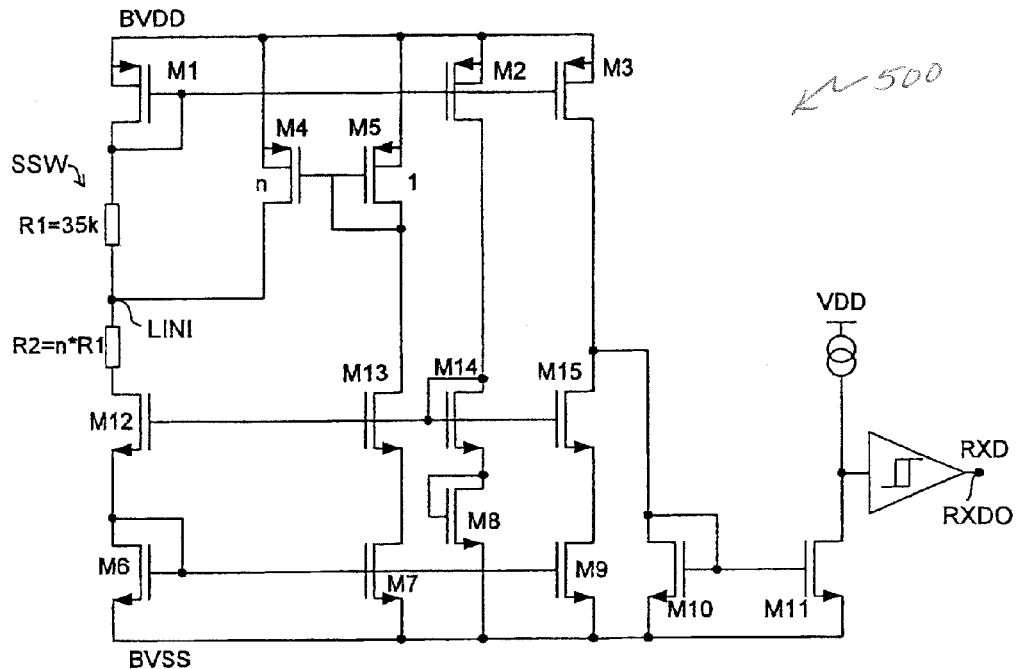
FIG. 5 illustrates a circuit schematic of a fifth embodiment of a LIN receiver.
Figure 6:
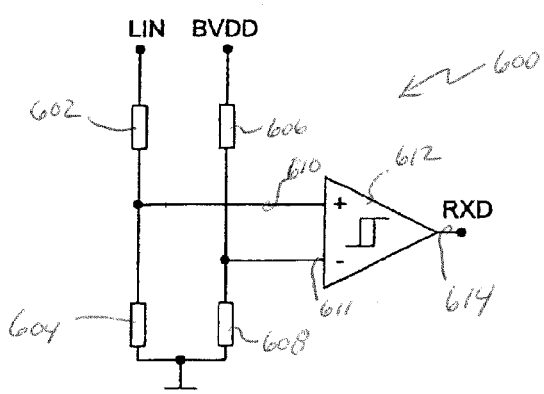
FIG. 6 illustrates a prior art receiver.

FIG. 4 illustrates a fourth embodiment, which has additional components compared to the specific embodiment depicted in FIG. 3.

A circuit configuration 400 illustrated in FIG. 4 also implements a hysteresis by using a seventeenth transistor M17 402, which is designed as a bipolar transistor, for example. In addition, the configuration has a switch S 404, which may be designed, for example, as an NMOS transistor. Specifically, the gate of the seventeenth transistor M17 is connected, among other things, to the gate of the sixth transistor M6 and will activate the sixth transistor M6. The source of the seventeenth transistor M17 is connected to the negative supply voltage of the BVSS bus. The drain of the seventeenth transistor M17 is connected to one terminal of the switch S 404. The other terminal of the switch S is connected to the source terminal of the twelfth transistor M12 128. The switch S 404 is connected through a connection to a node, which connects the drain terminal of the eleventh transistor M11 to the Schmitt trigger and the voltage source. Such a circuit configuration results in a hysteresis whose value is not constant, but proportional to the supply voltage. This behavior is advantageous, since the definition of hysteresis in the LIN specification refers to supply voltage BVDD.

In addition to the different depicted specific embodiments, a plurality of further implementation options exist for achieving a reduced or entirely non-existent power consumption. For example, bipolar transistors may be used instead of MOSFETs. In particular, an appropriately designed circuit configuration may also be implemented, which uses another voltage-to-current converter SSW instead of the one depicted composed of first and second ohmic resistors R1, R2. Thus, for example, MOS transistors connected as resistors may be used instead of the first and second resistors R1, R2.

In addition, additional cascodes, in particular NMOS and/or PMOS, may be used for enhancing the accuracy and/or voltage resistance in a corresponding circuit configuration. The use of additional protection elements which do not affect the mode of operation in principle, in particular resistors and/or Zener diodes, is also possible for enhancing the sturdiness of such a circuit configuration.

In particular, a current signal, instead of a voltage signal may be extracted by appropriately reconfiguring the circuit configurations.

Additionally switching over the seventh transistor M7 140 is also advantageous for adapting the compensation current to the hysteresis switchover, since in the depicted circuit configuration the compensation via the influence of the hysteresis transistor is not yet altogether ideal.

Although the present invention has been illustrated and described with respect to several preferred embodiments thereof, various changes, omissions and additions to the form and detail thereof, may be made therein, without departing from the spirit and scope of the invention.

What is claimed is:

1. A local interconnect network receiver having sleep/wake-up functionality, comprising:
   a voltage-to-current converter formed of a first resistor and a second resistor;
   an input to a local interconnect network bus wherein said input is connected between the first resistor and the second resistor of said voltage-to-current converter;

a first transistor having a source, gate and drain, the drain and gate of the first transistor being directly connected to the first resistor of the voltage-to-current converter;

an output; and a terminal for at least one supply voltage, wherein a plurality of transistors which are connected for activating the local interconnect network receiver in a recessive state of the local interconnect network bus via a state change on the local interconnect network into an active state of the receiver.

2. The local interconnect network receiver of claim 1, wherein a first resistor of the voltage-to-converter is connected and dimensioned as a pull-up resistor in such a way that, in the case of dominant level at the input, current flows through the first resistor.

3. The local interconnect network receiver of claim 2, wherein the plurality of transistors includes at least first, second and third transistors, which are preferably connected to mirror the current flow through the first resistor, and at least one eight and one fourteenth transistor and additional twelfth, thirteenth, and fifteenth transistors, connected as cascade transistors which are connected to switch the receiver and/or the output into the active mode.

4. The local interconnect network receiver of claim 3, wherein the second resistor of the voltage-to-current converter is wired so it may be connected to a negative supply voltage or to ground with the aid of the twelfth and sixth transistors.

5. The local interconnect network receiver of claim 4, wherein at least one third and one fifteenth transistor are connected between a positive supply voltage and the negative supply voltage or ground for comparing a current flow component through the first resistor and a current flow component through the second resistor.

6. The local interconnect network receiver of claim 5, wherein a tenth and an eleventh transistor are connected to the third and fifteenth transistors on the output side, in order to pull the output toward ground or toward the negative supply voltage of the bus.

7. The local interconnect network receiver of claim 4, wherein at least one fourth, one fifth, and one seventh transistor are connected between a positive supply voltage and the negative supply voltage or ground in such a way that a current flow component through the second resistor of the voltage-to-current converter activates the gate terminal of the seventh transistor and, through it, the fourth and the fifth transistors for compensating the current component through the second transistor.

8. The local interconnect network receiver of claim 7, wherein at least on eighth and one fourteenth transistor are connected between the positive supply voltage and the negative supply voltage or ground in such a way that, at recessive level at the input, they switch off a current flow through the second resistor with the aid of a switch.

9. The local interconnect network receiver of claim 8, wherein a switch and, for generating a hysteresis, a seventeenth transistor are connected as additional components in series between the second resistor and the negative supply voltage or ground, the switch then being switched to switch a current flow through the seventeenth transistor on or off, depending on a switching state at the output.

10. The local interconnect network receiver of claim 1, wherein the transistors are dimensioned, with the aid of scaling factors, to appropriately reduce all currents, except through a first resistor of the voltage-to-current converter.

11. The local interconnect network receiver of claim 9, wherein a sixteenth transistor is connected between a positive supply voltage and others of said plurality of transistors as an integrated polarity reversal protection diode.

* * * * *